United States Patent
Carducci et al.

(10) Patent No.: US 9,653,267 B2
(45) Date of Patent: May 16, 2017

(54) TEMPERATURE CONTROLLED CHAMBER LINER

(71) Applicants: James D. Carducci, Sunnyvale, CA (US); Kallol Bera, San Jose, CA (US); Nipun Misra, San Jose, CA (US); Larry D. Elizaga, Tracy, CA (US)

(72) Inventors: James D. Carducci, Sunnyvale, CA (US); Kallol Bera, San Jose, CA (US); Nipun Misra, San Jose, CA (US); Larry D. Elizaga, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 902 days.

(21) Appl. No.: 13/632,585

(22) Filed: Oct. 1, 2012

(65) Prior Publication Data

US 2013/0118686 A1  May 16, 2013

Related U.S. Application Data

(60) Provisional application No. 61/543,993, filed on Oct. 6, 2011.

(51) Int. Cl.
  *C23C 16/00* (2006.01)
  *H01J 37/32* (2006.01)

(52) U.S. Cl.
  CPC ... *H01J 37/32495* (2013.01); *H01J 37/32522* (2013.01); *Y10T 428/13* (2015.01); *Y10T 428/21* (2015.01); *Y10T 428/24273* (2015.01); *Y10T 428/24479* (2015.01)

(58) Field of Classification Search
  CPC .............................................. H01J 37/32495
  USPC ............................................................. 118/715
  See application file for complete search history.

(56) References Cited

U.S. PATENT DOCUMENTS

| | | | | |
|---|---|---|---|---|
| 5,690,795 A | * | 11/1997 | Rosenstein | H01L 21/67017 118/504 |
| 6,056,823 A | * | 5/2000 | Sajoto | C23C 16/4401 118/715 |
| 6,170,429 B1 | * | 1/2001 | Schoepp | H01J 37/32495 118/504 |
| 6,442,950 B1 | * | 9/2002 | Tung | F28F 19/02 118/724 |
| 6,797,068 B1 | * | 9/2004 | Yamasaki | C23C 16/45521 118/725 |
| 6,891,131 B2 | * | 5/2005 | Sakuma | C23C 16/481 118/501 |
| 2005/0150757 A1 | | 7/2005 | Black et al. | |
| 2006/0090855 A1 | * | 5/2006 | Kimura | H01L 21/67109 156/345.52 |
| 2008/0178797 A1 | * | 7/2008 | Fodor | C23C 16/46 118/75 |
| 2010/0248396 A1 | * | 9/2010 | Ogose | C23C 16/34 438/5 |
| 2012/0018402 A1 | | 1/2012 | Carducci et al. | |

* cited by examiner

*Primary Examiner* — Keath Chen
(74) *Attorney, Agent, or Firm* — Patterson + Sheridan, LLP

(57) ABSTRACT

A liner for a semiconductor processing chamber and a semiconductor processing chamber are provided. In one embodiment, a liner for a semiconductor processing chamber includes a body having an outwardly extending flange. A plurality of protrusions extend from a bottom surface of the flange. The protrusions have a bottom surface defining a contact area that is asymmetrically distributed around the bottom surface of the flange.

20 Claims, 4 Drawing Sheets

TEMPERATURE CONTROLLED CHAMBER LINER

CROSS-REFERENCE TO RELATED APPLICATIONS/PRIORITY CLAIM

This application claims benefit of U.S. Provisional Application Ser. No. 61/543,993, filed on Oct. 6, 2011, which is herein incorporated by reference in its entirety.

BACKGROUND

Field

Embodiments of the invention generally relate to a chamber liner for a semiconductor processing chamber.

Description of the Related Art

Chamber liners are typically used in semiconductor processing chambers to protect the chamber walls from unwanted deposition and/or plasma damage. During processing, the chamber liner is heated by a plasma formed within the chamber, while cooled by thermal conduction via the portions of the liner in contact with the walls of the semiconductor processing chamber. Since the semiconductor processing chamber does not provide a uniform heat sink at all points in which the processing chamber is in contact with the liner, the amount of heat transfer between the liner and processing chamber is azimuthally non-uniform, thus resulting in a non-uniform distribution of temperature on the surface of the liner. The non-uniform distribution of temperature, in turn, has an adverse effect on the uniformity of processing results. Thus, other process control parameters must often be adjusted to compensate for the non-uniformity of the liner temperature, thereby reducing the processing window and limiting the ability to effectively control processing results.

Thus, there is a need for an improved chamber liner.

SUMMARY

Embodiments of the present invention provide a liner for a semiconductor processing chamber and a semiconductor processing chamber are provided. In one embodiment, a liner for a semiconductor processing chamber includes a body having an outwardly extending flange. A plurality of protrusions extend from a bottom surface of the flange. The protrusions have a bottom surface defining a contact area that is asymmetrically distributed around the bottom surface of the flange.

In another embodiment, a liner for a semiconductor processing chamber includes a tubular body having an open top and an open bottom. The tubular body includes an inner cylindrical wall, an outer cylindrical wall, and a substrate passage slot formed the body. A flange extends outward from the outer cylindrical wall of the body. A plurality of protrusions extend from a bottom surface of the flange. A resistive heater is disposed in the body or flange radially inward of the protrusions. The protrusions have a bottom surface defining a contact area. The contract area of the protrusions have an asymmetrical distribution around the bottom surface of the flange, but is symmetrical relative to the substrate passage slot.

In yet another embodiment, a semiconductor processing chamber includes a chamber body having a liner disposed therein. The chamber body has a ledge exposed to a processing volume and a slit valve tunnel formed therethrough. The liner includes a liner body having a substrate passage slot aligned with the slit valve tunnel of the chamber body. A flange extends outward from the liner body. A plurality of protrusions extend from a bottom surface of the flange and maintaining the flange and liner body spaced-apart from the chamber body. The protrusions have a bottom surface defining a contact area with the ledge of the chamber body. The contract area of the protrusions have an asymmetrical distribution around the bottom surface of the flange.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
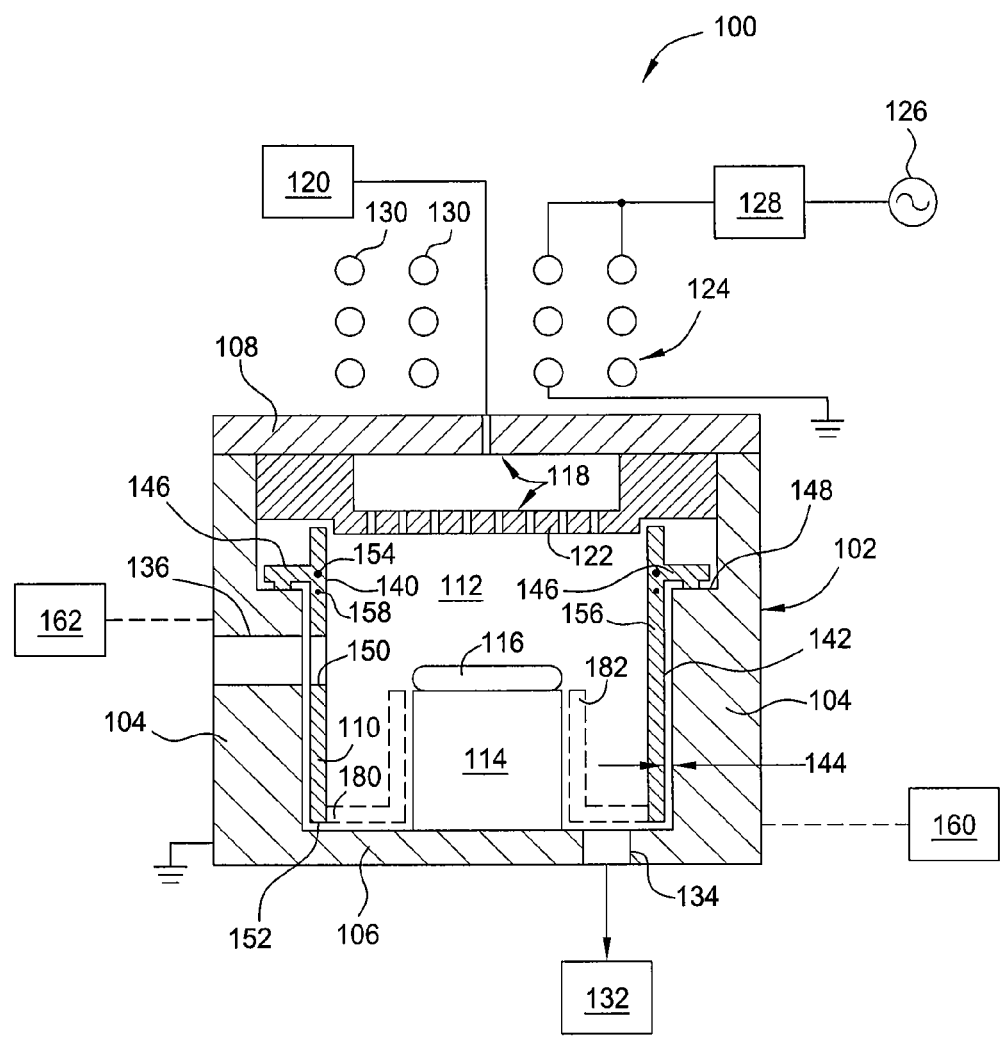
FIG. 1 is a simplified cross-sectional view of a semiconductor processing chamber having one embodiment of a chamber liner.

FIG. 1 is a simplified view of a semiconductor processing chamber 100 having one embodiment of a chamber liner 110 of the present invention. Although the exemplary processing chamber 100 is illustrated as an etch reactor, the liner 110 may be adapted for use in other types of processing chambers, such as chemical vapor deposition chambers, plasma treatment chambers, passing chambers and abatement chambers, among others.

The processing chamber 100 generally includes a chamber body 102 having sidewalls 104 and a bottom 106. A lid 108 is disposed on the chamber body 102, thereby enclosing a processing volume 112 within the chamber body 102. A substrate support 114 is positioned in the processing volume 112 and supports a substrate 116 thereon during processing. One or more gas introducing devices 118 are coupled to at least one of the chamber sidewalls 104 or lid 108 for providing processing gases to the processing volume 112 from a gas source 120. The gas introduction device 118 may be one or more gas inlets formed in the lid 108 and/or sidewalls 104, one or more gas injection nozzles coupled to the lid 108 and/or side 104, or a gas distribution plate (i.e., showerhead 122), as shown in FIG. 1.

One or more plasma generators 124 are positioned proximate the chamber body 102 and are coupled to an RF power source 126 through a matching network 128. In the embodiment depicted in FIG. 1, the plasma generators 124 are a pair of coaxial coils 130 positioned above the chamber lid 108. It is contemplated that the plasma generator 124 may alternatively be an electrode disposed on the substrate support 114 below the showerhead 122 or the showerhead 122 itself. Power provided from the RF power source 126 is utilized to maintain a plasma formed from the processing gases within the processing volume 112.

A pumping system 132 is coupled to an exhaust port 134 of the chamber body 102. The pumping system 132 is utilized to control the pressure within the processing volume 112 of the processing chamber 100, and to remove etch by-products and non-reactive gases.

One of the sidewalls 104 of the chamber body 102 additionally includes a slit valve tunnel 136. The slit valve tunnel 136 is aligned with a substrate passage slot 150 formed through the liner 110 to allow the substrate 116 to be robotically transferred into and out of the processing chamber 100. As the mass of aluminum comprising the chamber sidewall 104 through which the slit valve tunnel 136 is formed is less than that of the other sidewalls 104, the heat-sinking capacity of the chamber sidewall 104 through which the slit valve tunnel 136 is formed is relatively less than the adjacent sidewalls 104.

The liner 110 is disposed in the processing volume 112 immediately inward of the chamber sidewalls 104. The liner 110 has a cylindrical body 156 defined by an inside diameter wall 140 and an outside diameter wall 142. In one embodiment, the cylindrical body 156 has an open top and an open bottom, i.e., the cylindrical body 156 is tubular. The inside diameter wall 140 of the cylindrical body 156 faces the substrate support 114 and an outside diameter wall 142 immediately faces the chamber sidewall 104. The outside diameter wall 142 is dimensioned such that a small gap 144 is maintained with the chamber sidewall 104 so there is no direct conductive heat transfer via contact between the outside diameter wall 142 and the sidewall 104 of the chamber body 102. A flange 146 extends radially outward from the outside diameter liner wall 142 and rests upon a ledge 148 formed in the sidewalls 104 of the chamber body 102. The ledge 143 supports a bottom 152 of the liner 110 in a spaced apart relation above the bottom 106 of the chamber body 102 so that there is no direct conduction of heat between the bottom 152 of the liner 110 and the bottom 106 of the chamber body 102. Thus, the flange 146 acts as a heat sink for the liner body 156 as the heat transfer between the chamber liner 110 and the chamber body 102 predominantly occurs between the ledge 148 and the flange 146.

The liner 110 may optionally include a bottom wall 180 and inner wall 182, both shown in phantom. The bottom wall 180 extends inwardly from the inside diameter wall 140 to the inner wall 182. The inner wall 182 extends upwardly to shield and protect the outer diameter of the substrate support 114 for the plasma environment within the processing volume 112.

The liner 110 may optionally include a resistive heater 154. In the embodiment depicted in FIG. 1, the resistive heater 154 is embedded in the cylindrical body 156 of the liner 110 radially inward of the flange 146. In this position, the heat sinking flange 146 and the heat adding resistive heater 154 are horizontally aligned in series, thereby minimizing potential vertical temperature gradients along the cylindrical body of the liner 110 due to vertical offset in the position of the heating and cooling liner elements (i.e., the flange 146 and the heater 154).

A thermocouple 158 may also be embedded in the liner 110 proximate the heater 154. The thermocouple 158 is coupled to a controller 160 which provides close loop control to a power source 162 providing power and thereby controlling the heat generated by the heater 154.

Figure 2:
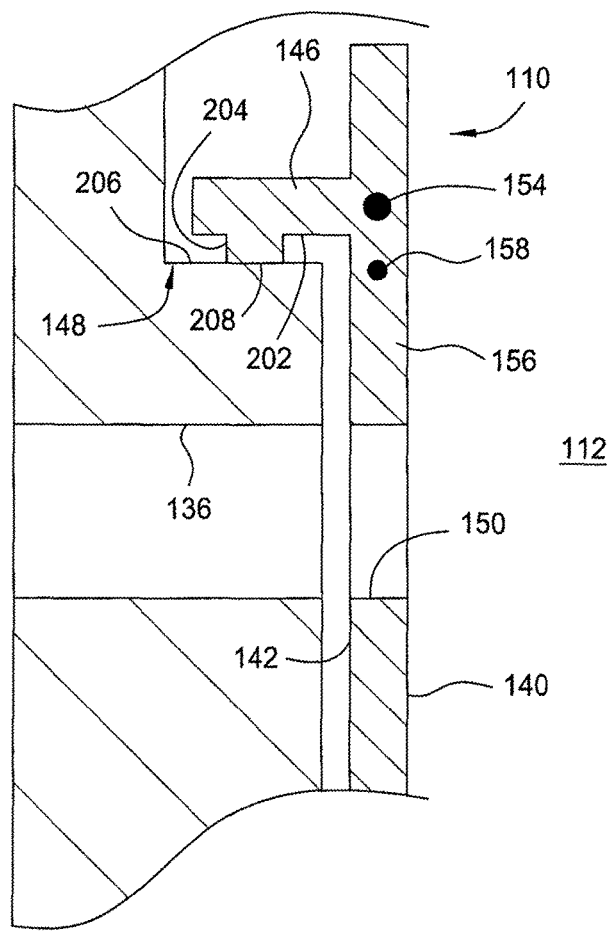
FIG. 2 is an enlarged partial sectional view of the processing chamber of FIG. 1 illustrating the interface between a flange of the liner and a ledge of the processing chamber.

FIG. 2 is an enlarged partial sectional view of the processing chamber 100 of FIG. 1 illustrating the interface between the flange 146 of the liner 110 and the ledge 148 of the chamber sidewall 104. A bottom surface 202 of the flange 146 includes a plurality of protrusions 204, one of which is shown in FIG. 2. The protrusions 204 extend downwardly from the bottom surface 202 of the flange 146, thereby maintaining the bottom surface 202 of the flange 146 and a top surface 206 of the ledge 148 in a spaced apart relationship. Thus, all conductive heat transfer between the flange 146 and the ledge 148 passes through the protrusions 204. Accordingly, the distribution, size, number, density, and shape of the protrusions 204 may be selected to tune the rate and azimuthal distribution of heat transfer between the liner 110 and the chamber body 102.

For example, in an application where less heat transfer between the liner 110 and the chamber body 102 is desirable, the contact surface area between the protrusion 204 and the ledge 148 may be small, for example, by providing a full radius or curved surface on a bottom 208 of the protrusion 204. In other embodiments where a high rate of heat transfer is desirable, the protrusion 204 may have a large contact surface area, for example, having a large planar area defining the bottom 208 of the protrusion 204 and having low surface roughness to provide a large and good heat transfer surface between the liner 110 and chamber body 102.

Figure 3:
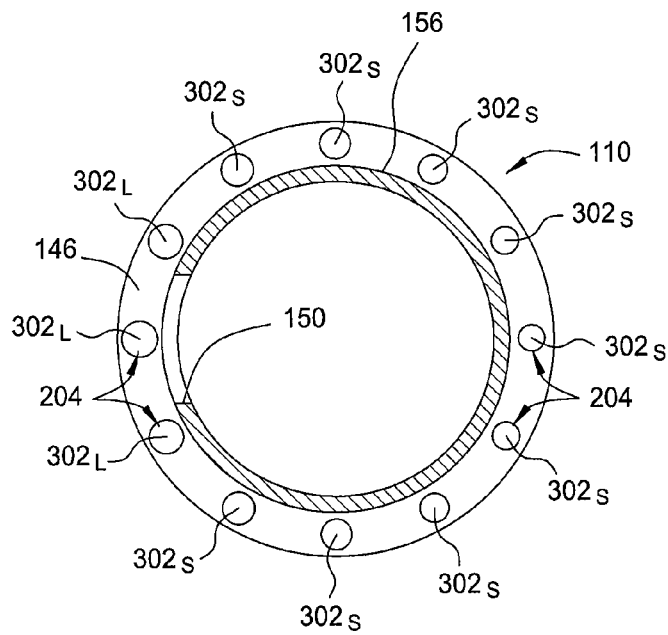
FIG. 3 is a sectional view of one embodiment of a chamber liner taken through a substrate passage slot.

FIG. 3 is a sectional view of the liner 110 taking through the substrate passage slot 150. As the substrate passage slot 150 formed through the liner 110 is aligned with the slit valve tunnel 136 formed through the chamber body 102 when the liner 110 is installed in the chamber body 102, the rate of heat transfer from the portion of the liner 110 adjacent the substrate passage slot 150 is less than the other portions of the liner 110 due to the reduced mass of material forming a chamber body 102 in the sidewall 104 containing the slit valve tunnel 136. Thus, to compensate for the difference in heat transfer rate, the region of the flange 146 above the slit valve tunnel 136 and, thus above the substrate transfer slot 150, includes protrusions 204 having more bottom contact surface area (shown as $302_L$) per unit area of the flange 146 as compared to the bottom contact surface area (shown as $302_S$) of the protrusions 204 disposed in a region of the flange 146 opposite the substrate transfer slot 150 and away from the slit valve tunnel 136.

In the embodiment depicted in FIG. 3, the number of protrusions 204 are uniformly distributed in a polar array around the flange 146, however, the surface area $302_L$ of the protrusions 204 contacting the region of the ledge 148 is proximate the slit valve tunnel 136 (i.e., the protrusions 204 proximate the substrate passage slot 150) are greater than the surface area $302_S$ of the protrusions 204 in the region of the flange 146 opposite slit valve tunnel 136 and substrate transfer slot 150. Thus, the total surface area $302_L$ of the protrusions 204 in the region of the flange 146 over the substrate transfer slot 150 allows heat to preferentially transfer from the liner 110 to the chamber body 102 relative to other regions of the liner 110. Accordingly, the additional surface area $302_L$ available for heat transfer in the region of the flange 146 above the slit valve tunnel 136 and substrate transfer slot 150 compensates for the reduced capacity of the chamber body 102 in the region of the slit valve tunnel 136 to absorb heat, therefore, balancing the total azimuthal heat transfer from the flange 146 to the chamber body 102 and resulting in a uniform azimuthal temperature gradient on the chamber liner 110. Advantageously, having a uniform azimuthal temperature gradient on the liner 110 allows for the other process control variables to be better utilized to radially tune the process performed in the processing chamber 100 instead of being utilized to correct an azithumal processing symmetry, thereby widening the process window and increasing the level of process control, particularly in the radial direction.

Figure 4A:
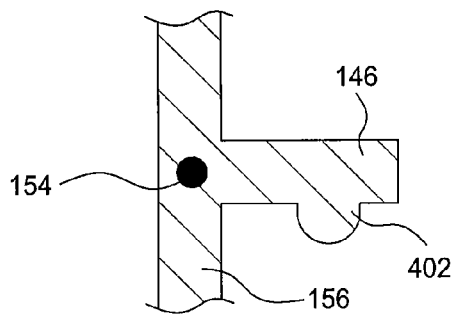
FIGS. 4A and 4B are partial sectional views of the chamber liner of FIG. 4 taken respectively through section lines 4A-4A and 4B-4B.
Figure 4:
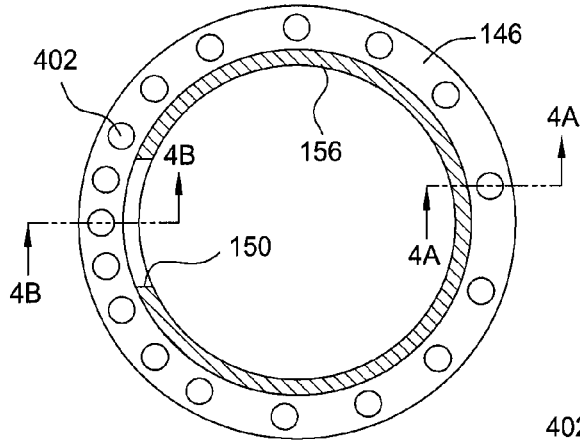
FIG. 4 is a sectional view of another embodiment of a chamber liner taken through a substrate passage slot.

FIG. 4 depicts a sectional view of another liner 400 taken through the slit valve tunnel 136 and substrate transfer slot 150 illustrating a plurality of protrusions 402 extending from the bottom of a flange 146. The liner 400 may include a resistive heater 154 and thermocouple 158 as discussed above. In the embodiment depicted in FIG. 4, the protrusions 402 are distributed asymmetrically on a bottom surface 202 of the flange 146 so that more protrusions 402 per unit area located in the region of the flange 146 proximate the slit valve tunnel 136 and substrate transfer slot 150 as compared to the region of the flange 146 opposite the slit valve tunnel 136 and substrate transfer slot 150. In this manner, the total contact area of the protrusions 402 per unit area of the flange 146 in the region of the slit valve tunnel 136 and substrate transfer slot 150 is greater than that in the region of the flange 146 opposite the slit valve tunnel 136 and substrate transfer slot 150 when the individual protrusions 402 even in embodiments having similar or identical flange contact area. Alternatively, the contact area of each protrusion 204 may also be varied to further increase the total protrusion bottom contact area per unit flange area in the region proximate the substrate transfer slot 150 relative to other regions of the flange 146.

Figure 4B:
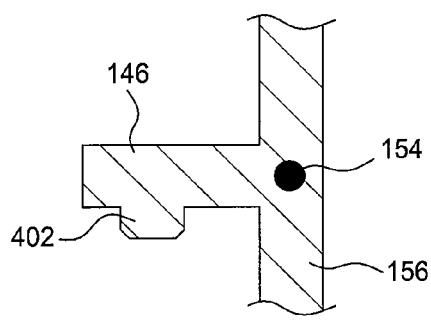

It is also contemplated that the bottom contact area of the protrusions 204 may be greater in the region of flange 146 proximate the slit valve tunnel 136 and substrate transfer slot 150 by having a substantially flat contact surface on the protrusions 402 in the region proximate the slit valve tunnel 136 and substrate transfer slot 150 while having rounded contact surface in the region of the flange 146 opposite the slit valve tunnel 136 and the substrate transfer slot 150, thus creating asymmetrical distribution of contact area which balances the heat transfer between the chamber body 102 and the liner 400 as illustrated in FIG. 4A-B.

Figure 5:
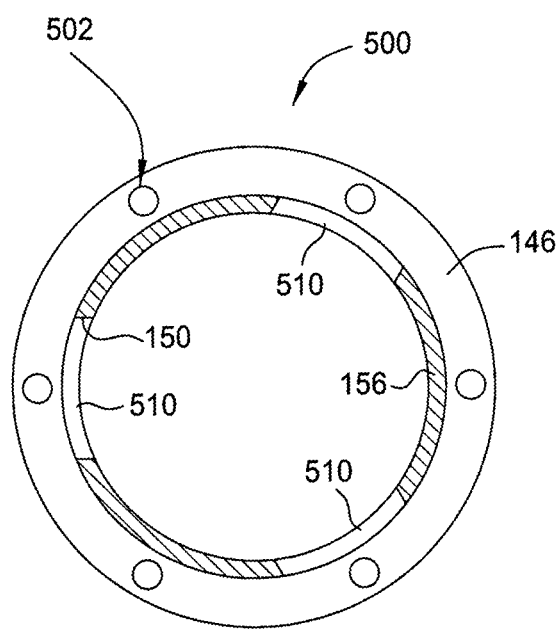
FIG. 5 is a sectional view of another embodiment of a chamber liner taken through a substrate passage slot.

FIG. 5 depicts another embodiment of a liner 500 having an asymmetrical distribution of protrusion surface contact area as described above. The liner 500 is constructed similar to the liners described above. For example, the asymmetrical of surface contact area may be provided by having an asymmetrical distribution of protrusions 502 on the flange 146. Alternatively, the asymmetrical distribution of contact area may be provided by changing the size of the surface contact area of the protrusions 502 through the size of the contact area or the curvature of the contact area defined by the bottom surface 504 of the protrusion 502. In the embodiment depicted in FIG. 5, the liner 500 additionally includes a plurality of slots 510 formed to create a symmetrical distribution of ground current return paths through the liner 500, wherein one of the slots 510 is the substrate transfer slot 150 which is sized to allow a substrate to pass through the liner 500 when aligned with the slit valve tunnel 136. In this manner, the symmetry of the ground current return path compensates for grounding while the distribution of protrusion contact area compensates for the non-uniform chamber heat sinking capacity, while the distribution of the protrusion contact area compensates for the non-uniform heat sinking capacity.

Although in the embodiments above, the asymmetrical azimuthal distribution of contact surface between the liner and chamber body is utilized to produce and tune an azimuthally non-uniform heat transfer heat around the liner flange which compensates for the difference in heat sinking capacity of the chamber body proximate the slit valve tunnel, it is contemplated that the asymmetrical distribution of contact surface may be selected to compensate for other thermal asymmetries of the processing chamber as needed. Thus, a chamber liner having an asymmetrical distribution of heat transferring protrusions is provided which enhances thermal uniformity of the liner, which accordingly enhances process control and process uniformity.

While the foregoing is directed to embodiments of the present invention, other and further embodiments of the invention can be devised without departing from the basic scope thereof, and the scope thereof is determined by the claims that follow.

What is claimed is:

1. A liner for a semiconductor processing chamber, comprising:
   a body having an outside diameter wall;
   a flange having a bottom surface, the bottom surface extending outward from the outside diameter wall of the body;
   a plurality of protrusions extending from the bottom surface of the flange, the protrusions having a bottom surface defining a contact area, the contact area of the protrusions having an asymmetrical distribution around the bottom surface of the flange.

2. The liner of claim 1, wherein a size of the contact areas for the protrusions is non-uniform.

3. The liner of claim 2, wherein the bottom surface of the protrusions in a first region of the flange have a first profile and the bottom surface of the protrusions in a second region of the flange have a second profile that is flatter than the first profile.

4. The liner of claim 3, wherein the first region of the flange is defined above a substrate passage slot formed through the body.

5. The liner of claim 3, wherein the second region of the flange is defined above a substrate passage slot formed through the body.

6. The liner of claim 2, wherein the bottom surface of the protrusions in a first region of the flange have a first contact area and the bottom surface of the protrusions in a second region of the flange have a second contact area that is different than the first contact area.

7. The liner of claim 6, wherein the first region of the flange is defined above a substrate passage slot formed through the body.

8. The liner of claim 6, wherein the second region of the flange is defined above a substrate passage slot formed through the body.

9. The liner of claim 1, wherein the protrusions are non-uniformly distributed around the bottom surface of the flange.

10. The liner of claim 9, wherein a density of protrusions is greater in a first region of the flange defined above a substrate passage slot formed through the body relative to a second region of the flange defined opposite the substrate passage slot.

11. The liner of claim 9, wherein a density of protrusions is less in a first region of the flange defined above a substrate passage slot formed through the body relative to a second region of the flange defined opposite the substrate passage slot.

12. The liner of claim 1 further comprising: a plurality of slots formed through the body, wherein one of the slots is a substrate passage slot.

13. The liner of claim 12, wherein the plurality of slot are arranged in a polar array.

14. The liner of claim 1 further comprising: a resistive heater disposed in the body radially inward of the flange.

15. A liner for a semiconductor processing chamber, comprising:
- a tubular body having an inner cylindrical wall and an outer cylindrical wall, the body having an open top and an open bottom;
- a substrate passage slot formed through the body;
- a flange having a bottom surface, the bottom surface extending outward from the outer cylindrical wall of the body, the flange spaced from both the top and the bottom of the body;
- a plurality of protrusions extending from the bottom surface of the flange, the protrusions having a bottom surface defining a contact area, the contact area of the protrusions having an asymmetrical distribution around the bottom surface of the flange, the distribution of the contact area being symmetrical relative to the substrate passage slot; and
- a resistive heater disposed in the body or flange radially inward of the protrusions.

16. The liner of claim 15, wherein the bottom surface of the protrusions are non-uniform.

17. The liner of claim 15, wherein the bottom surface of the protrusions in a first region of the flange have a first contact area and the bottom surface of the protrusions in a second region of the flange have a second contact area that is different than the first contact area.

18. The liner of claim 15, wherein the protrusions are non-uniformly distributed around the bottom surface of the flange.

19. The liner of claim 15 further comprising:
- a plurality of uniform slots formed through the body in a polar array, wherein one of the slots is the substrate passage slot.

20. A semiconductor processing chamber, comprising:
- a chamber body having a ledge exposed to a processing volume, the chamber body having a slit valve tunnel formed therethrough; and
- a liner disposed in the processing volume, the liner comprising:
  - a liner body having an outside diameter wall and a substrate passage slot aligned with the slit valve tunnel of the chamber body;
  - a flange having a bottom surface, the bottom surface extending outward from the outside diameter wall of the liner body;
  - a plurality of protrusions extending from the bottom surface of the flange and maintaining the flange and liner body spaced-apart from the chamber body, the protrusions having a bottom surface defining a contact area with the ledge of the chamber body, the contact area of the protrusions having an asymmetrical distribution around the bottom surface of the flange.

* * * * *